United States Patent
Piao et al.

(10) Patent No.: US 10,691,090 B2
(45) Date of Patent: Jun. 23, 2020

(54) METHOD OF PROCESSING DEVICE WAFER

(71) Applicant: DISCO CORPORATION, Tokyo (JP)

(72) Inventors: Meiyu Piao, Tokyo (JP); Masahisa Tokuyama, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/124,388

(22) Filed: Sep. 7, 2018

(65) Prior Publication Data
US 2019/0079478 A1  Mar. 14, 2019

(30) Foreign Application Priority Data
Sep. 12, 2017  (JP) .................... 2017-174708

(51) Int. Cl.
*G05B 19/42* (2006.01)
*G05B 19/042* (2006.01)
*H01L 21/78* (2006.01)
*H01L 21/3065* (2006.01)

(52) U.S. Cl.
CPC ........ *G05B 19/042* (2013.01); *H01L 21/3065* (2013.01); *H01L 21/78* (2013.01); *G05B 2219/45031* (2013.01)

(58) Field of Classification Search
CPC ......... H01L 21/31111; H01L 21/67086; H01L 21/67075; H01L 21/0214; H01L 21/02458; H01L 21/30604; H01L 21/67057; C30B 33/10; C09K 13/08
See application file for complete search history.

(56) References Cited

U.S. PATENT DOCUMENTS

| | | | |
|---|---|---|---|
| 2004/0187342 A1* | 9/2004 | Izuta | H01L 21/67086 34/467 |
| 2012/0225566 A1* | 9/2012 | Hamano | C23C 16/46 438/765 |
| 2015/0270151 A1* | 9/2015 | Yokoyama | H01L 21/67718 414/222.03 |

FOREIGN PATENT DOCUMENTS

JP   2006120834 A   5/2006

* cited by examiner

*Primary Examiner* — Duy Vu N Deo
(74) *Attorney, Agent, or Firm* — Greer Burns & Crain Ltd.

(57) ABSTRACT

A method of processing a device wafer includes the steps of applying a water-soluble protective film agent to a face side of the device wafer to form protective films thereon for protecting devices and leaving projected dicing lines exposed, dry-etching the device wafer through the protective films with a dry etching apparatus, recording a time when the water-soluble protective film agent is applied to the device wafer, confirming that the device wafer with the protective films formed thereon has been introduced into the dry etching apparatus, and issuing a warning if the introduction of the device wafer into the dry etching apparatus is not confirmed upon elapse of a predetermined time from the recorded time.

4 Claims, 6 Drawing Sheets

METHOD OF PROCESSING DEVICE WAFER

BACKGROUND OF THE INVENTION

Field of the Invention

The present invention relates to a method of processing a device wafer having a plurality of devices disposed on a face side thereof.

Description of the Related Art

For dry-etching a workpiece such as a device wafer, the devices disposed on a face side of the workpiece are coated with a resist film that is resistant to plasmas, and the resist film is used as a protective film in the dry etching process (see, for example, Japanese Patent Laid-open No. 2006-120834).

SUMMARY OF THE INVENTION

However, using a resist film as a protective film poses problems in that a resist film forming apparatus is required to form a protective film and an ashing apparatus is required to remove the protective film, tending to make the whole processing sequence complex and costly.

It is therefore an object of the present invention to provide a method of processing a device wafer to divide the device wafer into individual device chips more efficient than heretofore.

In accordance with an aspect of the present invention, there is provided a method of processing a device wafer having a plurality of devices disposed in respective areas demarcated on a face side thereof by a plurality of projected dicing lines, including the steps of applying, with a protective film forming apparatus, a water-soluble protective film agent to the face side of the device wafer to form protective films thereon for protecting the devices and leaving the projected dicing lines exposed, thereafter, dry-etching the device wafer through the protective films with a dry etching apparatus, recording a time when the water-soluble protective film agent is applied to the device wafer, confirming that the device wafer with the protective films formed thereon has been introduced into the dry etching apparatus, and issuing a warning if the introduction of the device wafer into the dry etching apparatus is not confirmed upon elapse of a predetermined time from the recorded time.

The protective film forming apparatus and the dry etching apparatus may be connected to a terminal apparatus through respective communication links, the method further including the step of calculating, with the terminal apparatus, the number of device wafers on which the protective films are to be formed based on an operation state of the dry etching apparatus.

The protective film forming apparatus and the dry etching apparatus may be connected to a terminal apparatus through respective communication links, the method further including the step of calculating, with the terminal apparatus, the number of device wafers on which the protective films are to be formed based on information input to the protective film forming apparatus and the dry etching apparatus.

The method of processing a device wafer according to the aspect of the present invention includes the protective film forming step for forming the protective films that protect the devices by applying the water-soluble protective film agent to the face side of the device wafer, while exposing the projected dicing lines, with the protective film forming apparatus, and the etching step for dry-etching the device wafer through the protective films with the dry etching apparatus. The protective films can easily be removed from the face side of the device wafer simply by supplying cleaning water thereto. Therefore, various pieces of equipment such as a resist film forming apparatus, an ashing apparatus, etc. are not required, resulting in a reduction in the cost, and the device wafer can efficiently be divided into individual chips.

The method of processing a device wafer according to the aspect of the present invention also includes the applying time recording step for recording the time when the water-soluble protective film agent is applied to the device wafer, the introduction confirming step for confirming that the device wafer on which the protective film forming step has been performed has been introduced into the dry etching apparatus, and the warning issuing step for issuing a warning if the introduction of the device wafer into the dry etching apparatus is not confirmed upon elapse of a predetermined time from the time recorded in the applying time recording step. Therefore, before the etching step, a warning is issued if the introduction of the device wafer into the dry etching apparatus is not confirmed in the introduction confirming step after elapse of a predetermined time from the time recorded in the applying time recording step. Consequently, it is possible to give a warning while the protective films can be removed from the device wafer, and the protective films may be removed and new protective films may be formed again on the face side of the device wafer. Therefore, it is unlikely to cause damage to the device wafer in its entirety.

In case the protective film forming apparatus and the dry etching apparatus are connected to the terminal apparatus through respective communication links, and the method further includes the calculating step for calculating, with the terminal apparatus, the number of device wafers on which the protective film forming step is to be performed based on an operation state of the dry etching apparatus, even if the processing time for the device wafer in the dry etching apparatus is longer than the processing time for the device wafer in the protective film forming apparatus, the protective film forming step and the etching step can be carried out after the appropriate number of device wafers on which to perform the protective film forming step has been calculated. In this manner, the dwelling time until the device wafer on which the protective films have been formed is introduced into the dry etching apparatus can be shortened. As a consequence, the device wafer can efficiently be divided into individual chips without deterioration of the protective films.

In case the protective film forming apparatus and the dry etching apparatus are connected to the terminal apparatus through respective communication links, and the method further includes the calculating step for calculating, with the terminal apparatus, the number of device wafers on which the protective film forming step is to be performed based on the information input to the protective film forming apparatus and the dry etching apparatus, since the protective film forming step can be carried out after the appropriate number of device wafers on which to perform the protective film forming step has been calculated, the device wafer can efficiently be divided into individual chips without deterioration of the protective films.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

1 Device Wafer

Figure 1:
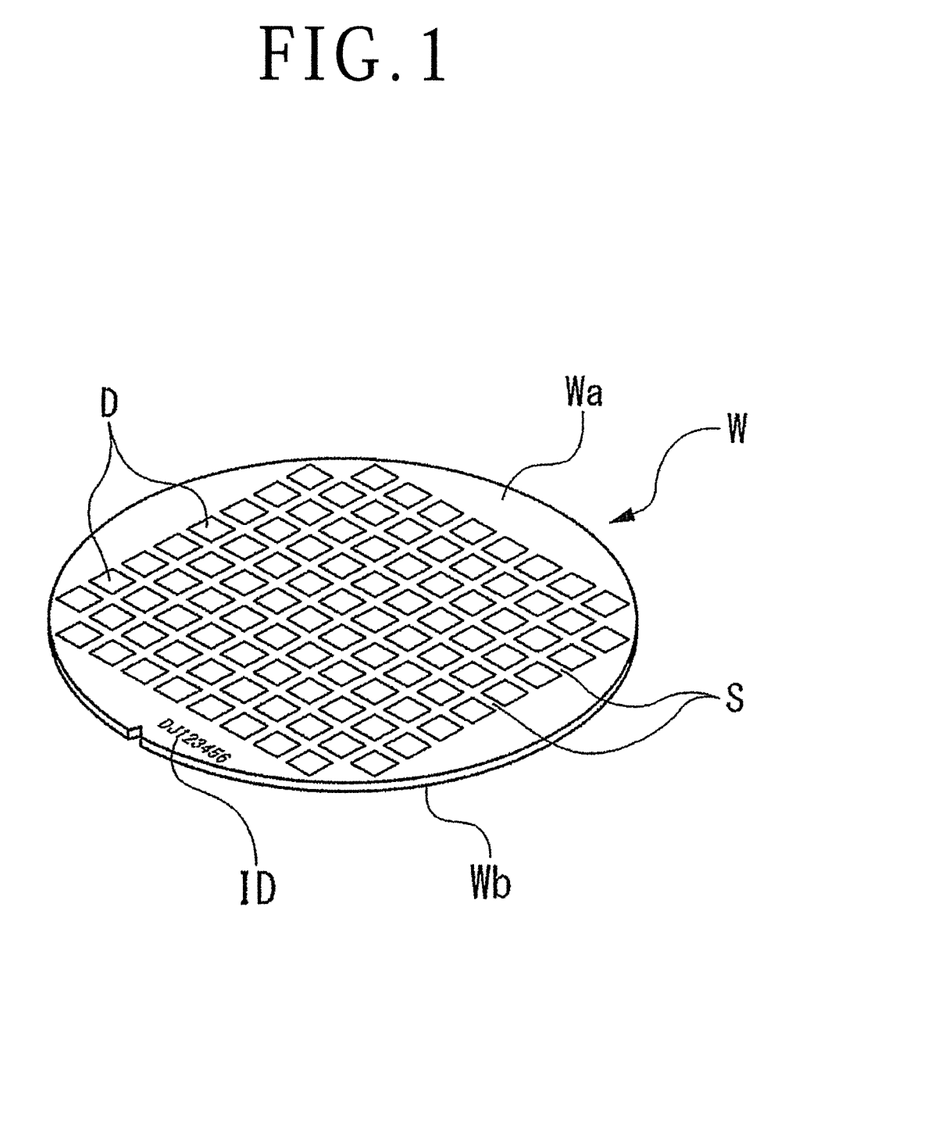
FIG. 1 is a perspective view of a device wafer.

As depicted in FIG. 1, a device wafer W is a disk-shaped workpiece, for example, and has a face side Wa that is demarcated by a grid of projected dicing lines S into a plurality of areas with respective devices D disposed therein. The device wafer W also has a reverse side Wb, opposite the face side Wa, serving as a surface to be processed as described below. The face side Wa of the device wafer W bears an individual identification code ID such as a number, a bar code, or the like that identifies an individual device wafer. The individual identification code ID may be placed on the reverse side Wb or within the device wafer W, or applied to an object combined with the device wafer W such as a support plate or a protective tape that is stuck to the device wafer W or an annular frame that is integrally joined to the device wafer W by a tape.

2 Method of Processing a Device Wafer

Figure 2:
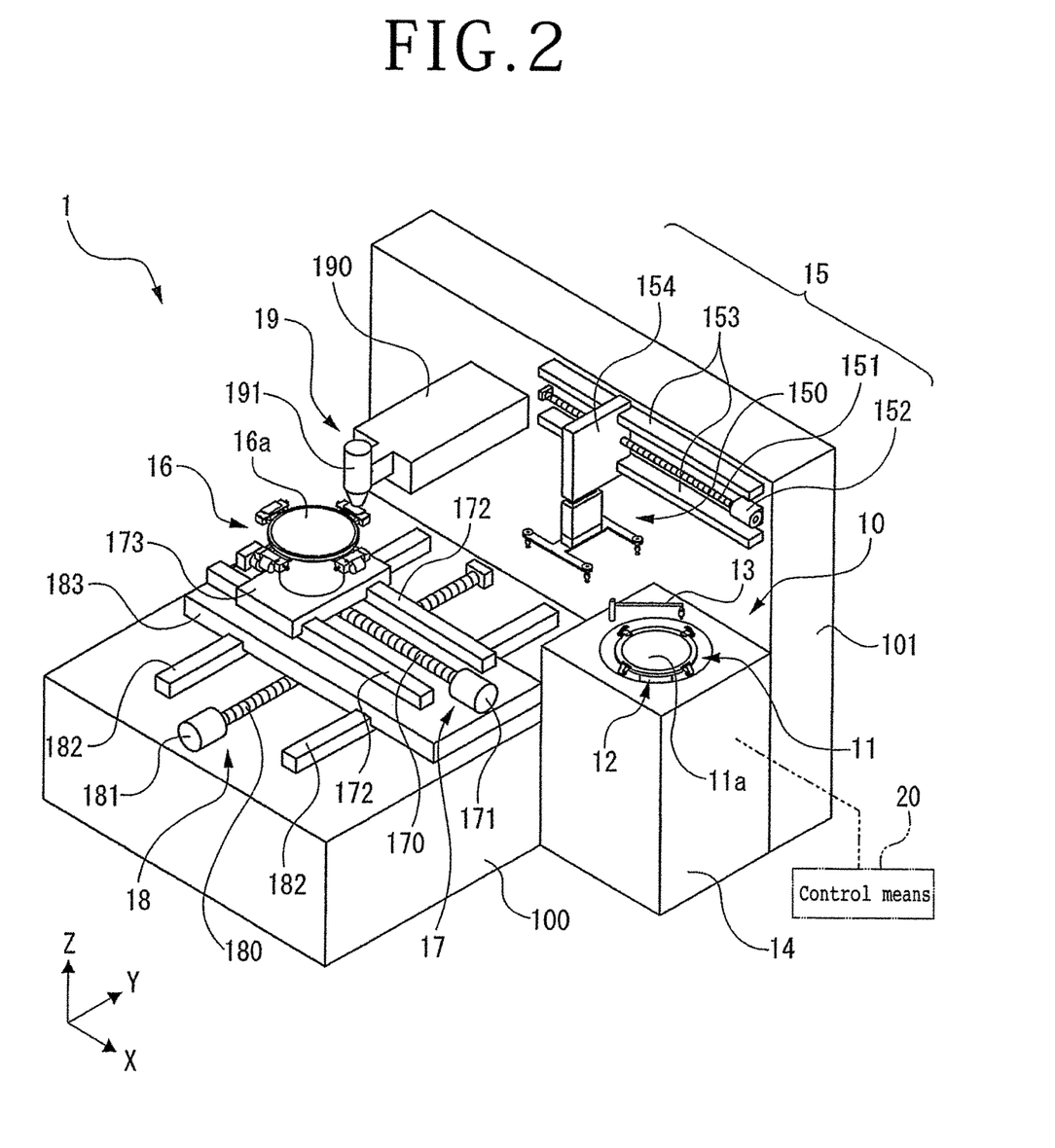
FIG. 2 is a perspective view depicting an example of a protective film forming apparatus.

Using a protective film forming apparatus 1 depicted in FIG. 2, a protective film for protecting the devices D on the device wafer W at the time the device wafer W is dry-etched is formed on the face side Wa of the device wafer W. The protective film forming apparatus 1 has an apparatus base 100, a column 101 erected at a rear side of the apparatus base 100 along a Y-axis indicated by the arrow Y, and protective film forming means 10 disposed adjacent to the column 101 at a front side of the apparatus base 100 along an X-axis indicated by the arrow X.

Figure 3:
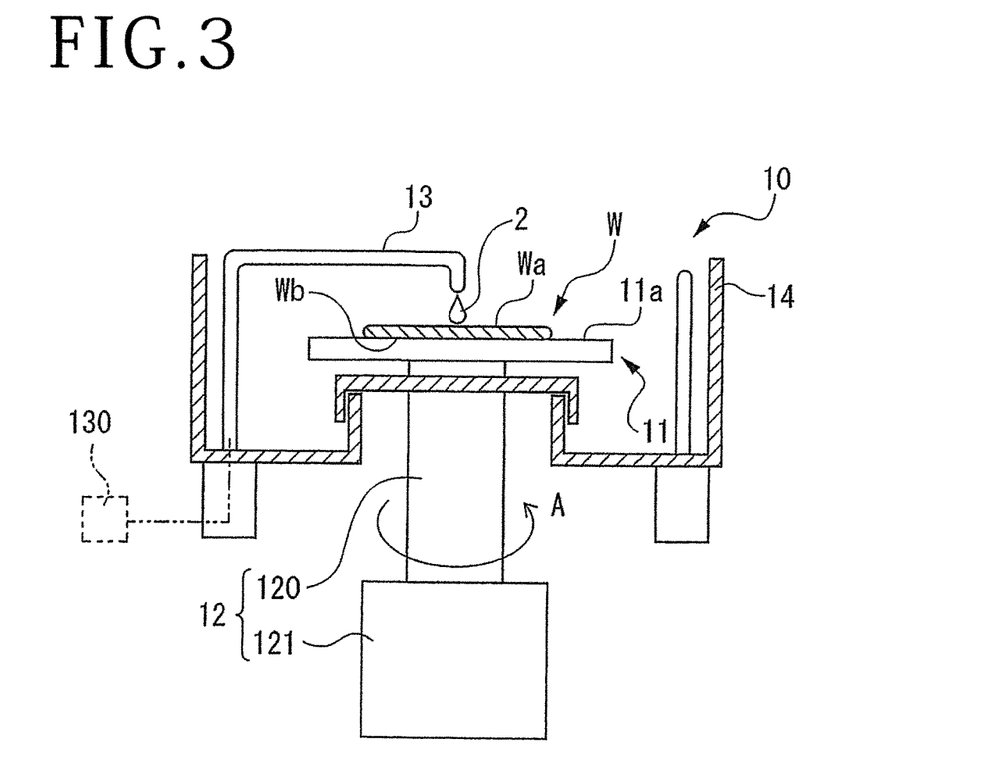
FIG. 3 is a cross-sectional view illustrating the manner in which a water-soluble protective film agent is applied to a face side of the device wafer in a protective film forming step.

The protective film forming means 10 includes a rotatable spinner table 11 for holding the device wafer W thereon, rotating means 12 for rotating the spinner table 11, an ejection nozzle 13 for ejecting a predetermined amount of water-soluble protective film agent onto the device wafer W held on the spinner table 11, and a tubular cover 14 surrounding the spinner table 11. The spinner table 11 has an upper surface serving as a holding surface 11a for holding the device wafer W under suction thereon. As depicted in FIG. 3, the rotating means 12 includes a rotatable shaft 120 having a vertical central axis and an upper end coupled to the spinner table 11, and an electric motor 121 connected to the lower end of the rotatable shaft 120. When the electric motor 121 is energized, it rotates the rotatable shaft 120 about its vertical central axis, rotating the spinner table 11 at a predetermined speed. The ejection nozzle 13 is connected to a water-soluble protective film agent source 130.

As depicted in FIG. 2, the apparatus base 100 supports thereon a holding table 16 having a holding surface 16a for holding the device wafer W under suction thereon, processing feed means 17 for processing-feeding the holding table 16 in a processing feed direction along the X-axis, and indexing feed means 18 for indexing-feeding the holding table 16 in an indexing feed direction along the Y-axis.

The processing feed means 17 includes a ball screw 170 extending along the X-axis, an electric motor 171 connected to an end of the ball screw 170, a pair of guide rails 172 extending parallel to the ball screw 170 along the X-axis, and an X-axis base 173 movable along the guide rails 172. The holding table 16 is supported on an upper surface of the X-axis base 173, whose lower surface is held in sliding contact with the guide rails 172. The ball screw 170 is threaded through a nut, not depicted, on a central portion of the lower surface of the X-axis base 173. When the electric motor 171 is energized, it rotates the ball screw 170 about its central axis, moving the X-axis base 173 along the guide rails 172 thereby to processing-feed the holding table 16 along the X-axis.

The indexing feed means 18 includes a ball screw 180 extending along the Y-axis, an electric motor 181 connected to an end of the ball screw 180, a pair of guide rails 182 extending parallel to the ball screw 180 along the Y-axis, and a Y-axis base 183 movable along the guide rails 182. The holding table 16 is supported on an upper surface of the Y-axis base 183 through the processing feed means 17. The Y-axis base 183 has a lower surface held in sliding contact with the guide rails 182. The ball screw 180 is threaded through a nut, not depicted, on a central portion of the lower surface of the Y-axis table 183. When the electric motor 181 is energized, it rotates the ball screw 180 about its central axis, moving the Y-axis base 183 along the guide rails 182 thereby to indexing-feed the holding table 16 along the Y-axis.

On a front surface of the column 101, there are disposed delivery means 15 for delivering the device wafer W between the holding table 16 and the spinner table 11, and laser beam applying means 19 for emitting a laser beam and processing the device wafer W with the laser beam. The laser beam applying means 19 includes an elongate casing 190 having a proximal end joined to the column 101 and extending along the Y-axis, and a processing head 191 disposed on a distal end of the elongate casing 190. The elongate casing 190 houses therein a laser oscillator for laser oscillating and generating a laser beam having a wavelength that is absorbable by the water-soluble protective film agent. The processing head 191 houses therein a condensing lens, not depicted, for focusing the laser beam emitted from the laser oscillator.

The delivery means 15 includes a holder 150 for holding the device wafer W, a ball screw 151 extending along the X-axis, an electric motor 152 connected to an end of the ball screw 151, a pair of guide rails 153 extending parallel to the ball screw 151 along the X-axis, and a movable unit 154 movable along the X-axis and supporting the holder 150 thereon. The movable unit 154 is held in sliding contact with the guide rails 153 and has a nut on a central portion thereof which is threaded over the ball screw 151. With the device wafer W held by the holder 150, when the electric motor 152 is energized, it rotates the ball screw 151 about its central axis, moving the movable unit 154 along the guide rails 153 thereby to deliver the device wafer W to either the spinner table 11 or the holding table 16.

The protective film forming apparatus 1 includes control means 20 for controlling the various actuating mechanisms referred to above. The control means 20 has a storage device such as a memory and a central processing unit (CPU). The memory of the control means 20 stores processing conditions, information on the device wafer W to be processed, and so on. The processing conditions include, for example, a rotational speed of the spinner table 11, an amount of water-soluble protective film agent to be supplied, a period of time over which the water-soluble protective film agent is to be ejected, a film thickness to which a water-soluble protective film is to be formed, a processing feed speed of the holding table 16, an output power level of the laser beam, etc. The information on the device wafer W includes, for example, the individual identification code ID of the device wafer W, the number of projected dicing lines S, etc.

(Protective Film Forming Step)

A protective film forming step is carried out using the protective film forming apparatus 1 thus constructed. The protective film forming step includes a protective film agent applying step for applying the water-soluble protective film agent and a projected dicing line exposing step for removing the water-soluble protective film agent to expose the projected dicing lines S to form a protective film.

(Protective Film Agent Applying Step)

As depicted in FIG. 3, the reverse side Wb of the device wafer W is placed on the holding surface 11a of the spinner table 11. A suction source, not depicted, connected to the holding surface 11a is actuated to hold the device wafer W under suction on the holding surface 11a. Then, the ejection nozzle 13 is turned to move the tip end thereof to a position above a central area of the device wafer W held on the spinner table 11. The motor 121 is energized to rotate the rotatable shaft 120 about its central axis, thereby rotating the spinner table 11 at a rotational speed of 50 rpm, for example, in the direction indicated by the arrow A.

Figure 4:
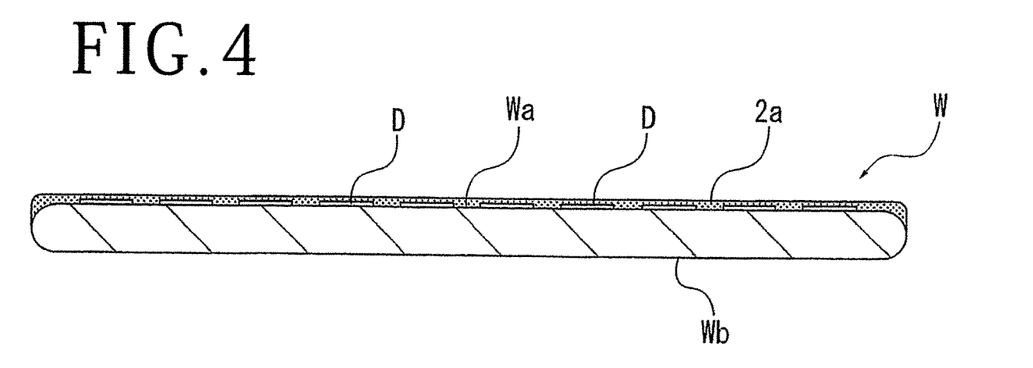
FIG. 4 is a cross-sectional view of the device wafer coated with the protective film agent.

While the spinner table 11 is rotating, the injection nozzle 13 drops a water-soluble protective film agent 2 onto the face side Wa of the device wafer W. The water-soluble protective film agent 2 may include a water-soluble liquid resin such as polyvinyl pyrrolidone (PVP) or polyvinyl alcohol (PVA), for example. The water-soluble protective film agent 2 applied to the face side Wa is caused to flow radially outwardly from the central area of the face side Wa to cover the face side Wa in its entirety under centrifugal forces generated by the rotation of the spinner table 11. Then, the spinner table 11 is rotated at 2000 rpm for 60 seconds, for example, drying the water-soluble protective film agent 2 on the face side Wa. In this manner, as depicted in FIG. 4, the entire face side Wa of the device wafer W is covered with a thin film 2a formed from the water-soluble protective film agent 2. If the thin film 2a is not sufficiently dried by the rotation of the spinner table 11, then it may additionally be dried by baking, for example.

(Applied Time Recording Step)

Concurrent with the protective film forming step, a time at which the water-soluble protective film agent 2 is applied to the face side Wa of the device wafer W is recorded. The time at which the water-soluble protective film agent 2 is applied to the face side Wa may be a time when the water-soluble protective film agent 2 is applied and the thin film 2a is formed to a predetermined thickness on the face side Wa, or a time when the drying of the water-soluble protective film agent 2 by the rotation of the spinner table 11 is completed, or a time when the injection nozzle 13 starts to drop the water-soluble protective film agent 2 onto the face side Wa of the device wafer W. The control means 20 depicted in FIG. 2 stores the time at which the water-soluble protective film agent 2 is applied.

(Projected Dicing Line Exposing Step)

Then, the delivery means 15 removes the device wafer W from the spinner table 11 and delivers the device wafer W to the holding table 16. When the device wafer W is placed on the holding surface 16a of the holding table 16, a suction source, not depicted, connected to the holding surface 16a is actuated to hold the device wafer W under suction on the holding surface 16a.

The processing feed means 17 moves the holding table 16 to a position below the laser beam applying means 19, and positions the processing head 191 in alignment with one of the projected dicing lines S. Specifically, an alignment camera, not depicted, captures an image of the face side Wa of the device wafer W, and one of the projected dicing lines S which is to be processed is detected by processing the captured image according to pattern matching or the like, after which the holding table 16 is index-fed along the Y-axis by the indexing feed means 18 to position the projected dicing line S and the processing head 191 into alignment with each other.

Figure 5:
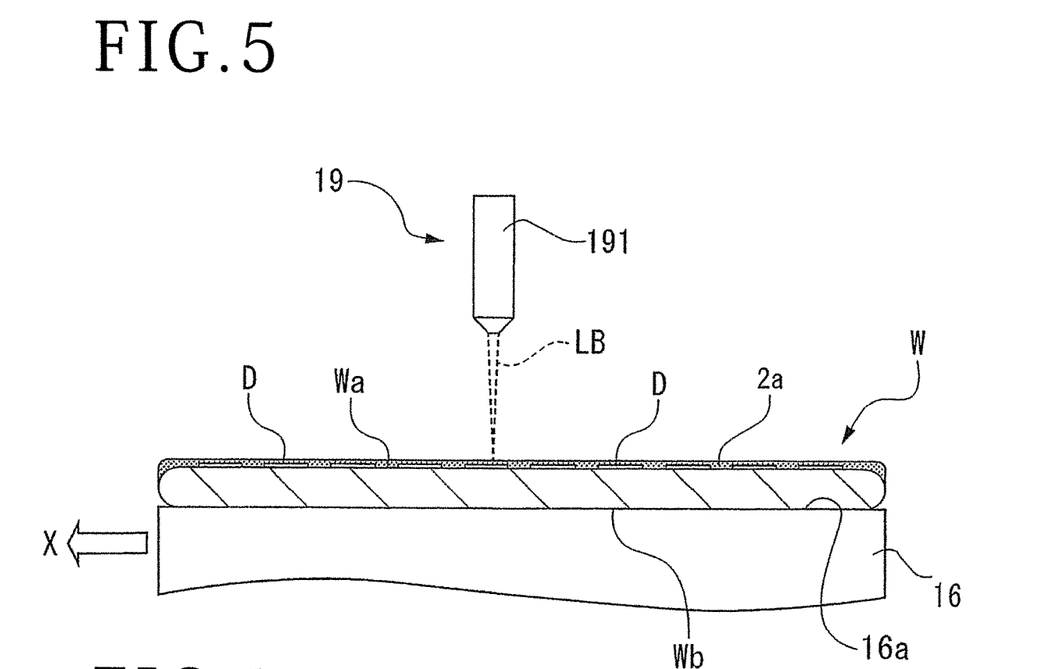
FIG. 5 is a cross-sectional view of the device wafer, illustrating the manner in which projected dicing lines are exposed in the protective film forming step.

Then, as depicted in FIG. 5, the holding table 16 is moved along the X-axis, for example, moving the processing head 191 and the device wafer W relatively to each other in a direction parallel to the device wafer W, while at the same time the processing head 191 applies a laser beam LB having a wavelength absorbable by the water-soluble protective film agent 2 to the thin film 2a along the projected dicing line S, thereby removing the thin film 2a from over the projected dicing line S. The laser beam LB may be applied a plurality of times to the thin film 2a along the projected dicing line S though the number of times that the laser beam LB is applied is not limited to any particular number.

Figure 6:
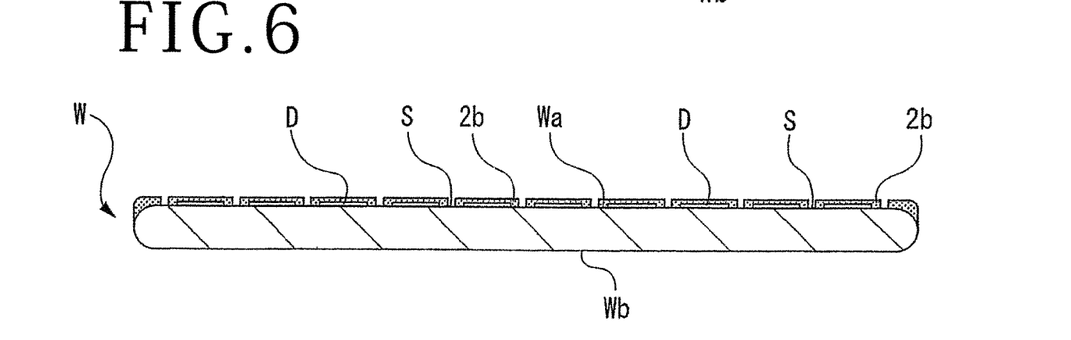
FIG. 6 is a cross-sectional view of the device wafer, illustrating the manner in which the projected dicing lines are exposed and a protective film is formed.

After the laser beam LB has been applied along the projected dicing line S along the X-axis, removing the thin film 2a therefrom, the holding table 16 depicted in FIG. 2 is indexing-fed along the Y-axis to position the processing head 191 above an adjacent projected dicing line S. Then, the holding table 16 is moved along the X-axis and the processing head 191 applies the laser beam LB to the thin film 2a along the projected dicing line S, removing the thin film 2a from over the projected dicing line S, in the same manner as described above. The above process is repeated to remove the thin film 2a along all the projected dicing lines S, thereby exposing the projected dicing lines S as depicted in FIG. 6 and forming protective films 2b covering the respective devices D for protecting the devices D in a dry etching process. The protective film forming step is now finished.

Figure 7:
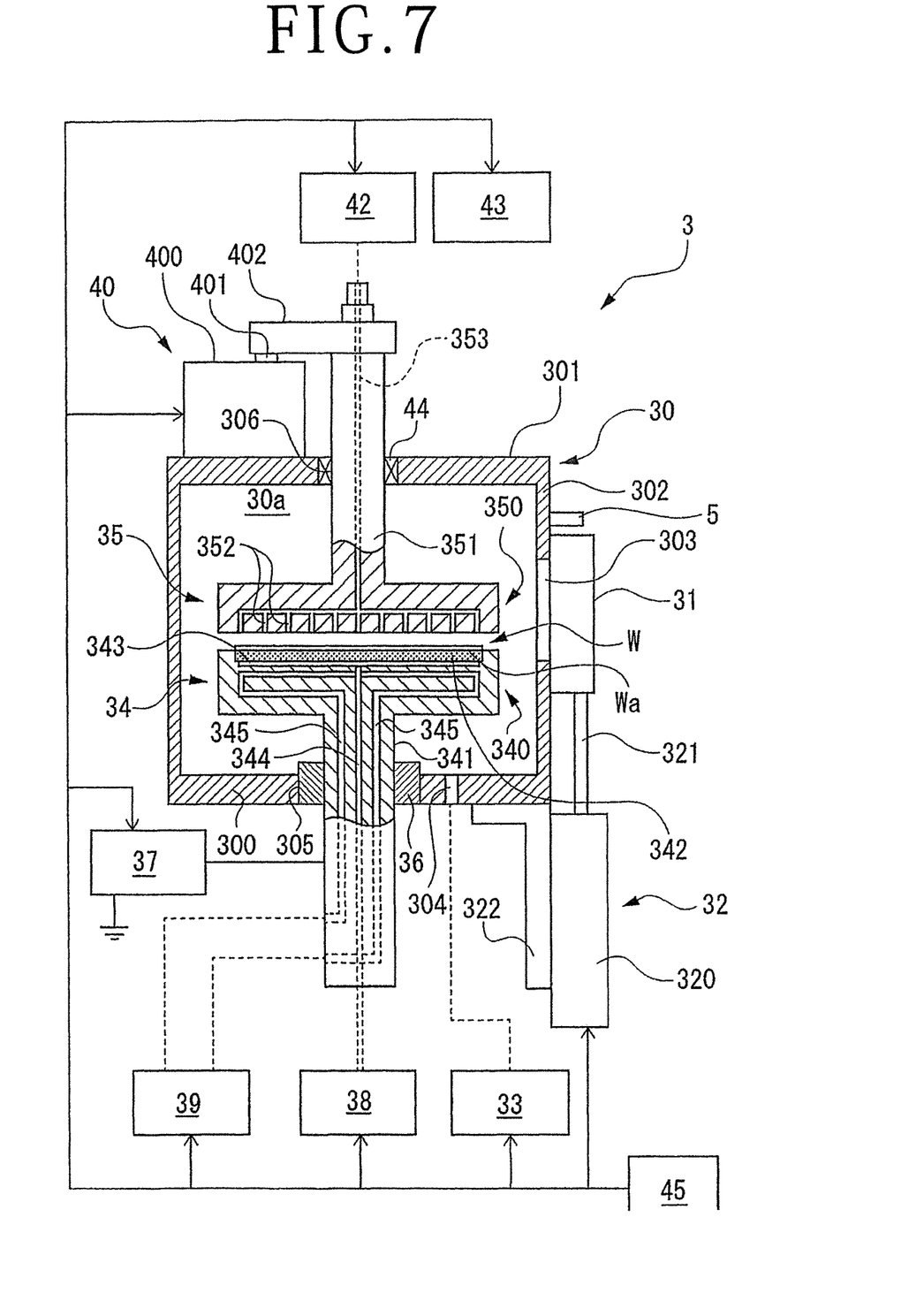
FIG. 7 is a cross-sectional view depicting an example of a dry etching apparatus.

After the protective film forming step has been carried out, a dry etching process is performed on the device wafer W through the protective films 2b, using a dry etching apparatus 3 depicted in FIG. 7. The dry etching apparatus 3 includes a chamber 30 having a processing space 30a defined therein for performing a dry etching process (plasma etching process) on the device wafer W, the processing space 30a being surrounded by a bottom wall 300, an upper wall 301, and a side wall 302 of the chamber 30. The side wall 302 has an opening 303 defined therein for taking the device wafer W therethrough into and out of the chamber 30. A gate 31 for selectively opening and closing the opening 303 is mounted on the side wall 302 outside of the opening 303. The gate 31 is vertically movable by opening and closing means 32. The opening and closing means 32 includes an air cylinder 320 and a piston rod 321 movable by the air cylinder 320 and connected to the gate 31. The air cylinder 320 is mounted on the bottom wall 300 of the chamber 30 by a bracket 322.

The bottom wall 300 has a discharge port 304 defined therein that is held in fluid communication with a gas discharger 33 such as a vacuum pump or the like. When the gas discharger 33 is actuated, a used gas is discharged from the processing space 30a out of the dry etching apparatus 3 through the discharge port 304.

The chamber 30 houses therein a lower electrode unit 34 and an upper electrode unit 35 that are disposed in vertically facing relation to each other. The lower electrode unit 34 includes a chuck table 340 for holding the device wafer W thereon and a cylindrical support 341 supporting the chuck table 340 on its upper end. The support 341 extends vertically through a hole 305 defined in the bottom wall 300 and is sealed by an insulator 36 interposed between the support 341 and the bottom wall 300.

The lower electrode unit 34 is electrically connected to a high-frequency power supply 37. The upper electrode unit 35 is electrically connected to a high-frequency power supply, not depicted. When high-frequency voltages are applied to the lower electrode unit 34 and the upper electrode unit 35, a reaction gas in the processing space 30a is plasmatized. The high-frequency voltages may have frequencies and power levels adjusted for drawing etching species (ions) into the device wafer W.

A suction holder 342 made of a porous material is disposed on an upper portion of the chuck table 340. The chuck table 340 has a suction groove 343 defined therein directly beneath the suction holder 342 and held in fluid communication with a suction source 38 through a suction channel 344 defined in the chuck table 340 and the support 341. Suction forces from the suction source 38 are transmitted through the suction channel 344 and act in the suction groove 343, causing the suction holder 342 on the chuck table 340 to hold the device wafer W under suction thereon. The chuck table 340 is not limited to the structure illustrated in the present embodiment, but may be an electrostatic chuck table with an electrode disposed therein. When a DC voltage is applied to the electrode in the electrostatic chuck table, the device wafer W is attracted to the electrostatic chuck table under electrostatic forces such as Coulomb forces.

The chuck table 340 and the support 341 also have cooling passageways 345 defined therein that are held in fluid communication with a coolant supply source 39. When the coolant supply source 39 is actuated, a coolant from the coolant supply source 39 circulates through the cooling passageways 345. Therefore, when a dry etching process is carried out, the lower electrode unit 34 can be cooled by the circulating coolant to remove heat therefrom.

The upper electrode unit 35 has a gas ejector 350 and a cylindrical support 351 that supports the gas ejector 350. The gas ejector 350 has a plurality of ejection ports 352 defined therein for ejecting a reaction gas into the processing space 30a. The ejection ports 352 are connected to reaction gas supply sources 42 and 43 through a flow passageway 353 defined in the support 351 and the gas ejector 350. The reaction gas supply source 42 is filled with an etching gas such as $SF_6$, for example. The reaction gas supply sources 43 is filled with a deposition gas such as $C_4F_8$, for example.

The support 351 extends through a hole 306 defined in the upper wall 301 of the chamber 30, and is vertically movably supported by a seal 44 mounted in the hole 306. A lifting and lowering mechanism 40 is connected to the upper electrode unit 35. The lifting and lowering mechanism 40 includes an air cylinder 400, a piston rod 401 movable by the air cylinder 400, and a lifting and lowering member 402 connected to an upper end of the piston rod 401 and an upper part of the support 351. When the lifting and lowering mechanism 40 is actuated, the support 351 and the gas ejector 350 are vertically moved.

The dry etching apparatus 3 further includes control means 45 for controlling the opening and closing means 32, the gas discharger 33, the high-frequency power supply 37, the suction source 38, the coolant supply source 39, the lifting and lowering mechanism 40, and the reaction gas supply sources 42 and 43. The control means 45 has a storage device such as a memory and a CPU. The memory of the control means 45 stores etching conditions, information on the device wafer W, etc.

An identification code reading unit 5 for reading the individual identification code ID of the device wafer W is mounted on the side wall 302 above the gate 31. The identification code reading unit 5 includes a bar code reader, for example. The identification code reading unit 5 can read the individual identification code ID on the device wafer W when the device wafer W moves through the opening 303 into the chamber 30. The individual identification code ID that has been read by the identification code reading unit 5 is sent to the control means 45. The position in which the identification code reading unit 5 is disposed is not limited to the position according to the present embodiment.

(Introduction Confirming Step)

Before going to an etching step to be described below, the introduction of the device wafer W into the dry etching apparatus 3 is confirmed. Specifically, when the opening and closing means 32 lowers the gate 31, opening the opening 303, and the device wafer W is introduced through the opening 303 into the chamber 30, the identification code reading unit 5 reads, from above, the individual identification code ID on the device wafer W on which the protective film forming step has been performed. The read individual identification code ID is sent from the identification code reading unit 5 to the control means 45. The control means 45 refers to the information on the device wafer W stored in the memory, and if the read individual identification code ID and the individual identification code ID stored in the memory agree with each other, the control means 45 confirms that the device wafer W has been introduced into the chamber 30 of the dry etching apparatus 3.

(Etching Step)

The device wafer W is placed on the suction holder 342 on the chuck table 340, and the device wafer W with the face side Wa exposed upwardly is held under suction on the suction holder 342 by suction forces from the suction source 38. Then, the upper electrode unit 35 is lowered toward the lower electrode unit 34, and the reaction gas supply sources 42 and 43 supply an etching gas to the flow passageway 353. The etching gas is then ejected from the ejection ports 352 in the gas ejector 350, and a high-frequency voltage is applied between the gas ejector 350 and the chuck table 340, plasmatizing the etching gas in the chamber 30. A bias high-frequency voltage is applied to the device wafer W, drawing etching species (ions) into the device wafer W thereby to etch the device wafer W. The etching step according to the present embodiment is carried out according to a cycle etching process (Bosch process) in which etching and film deposition are repeatedly performed.

An example of conditions used in the etching step according to the present embodiment is as follows:
[Common Conditions for Eching and Film Deposition]
High-frequency electric power frequency: 13.56 MHz
Stage temperature: 10° C.
Device wafer cooling He pressure: 2000 Pa
[Etching Conditions]
Electric power applied to coil: 2500 W
Electric power applied to stage: 150 W
Gas species: $SF_6$
Gas flow rate: 400 sccm
Process pressure: 25 Pa
Processing time: 5 seconds
[Conditions for Film Deposition]
Electric power applied to coil: 2500 W
Electric power applied to stage: 50 W
Gas species: $C_4F_8$
Gas flow rate: 400 sccm
Process pressure: 25 Pa
Processing time: 3 seconds In the etching step, etching and film deposition are alternately repeated in several tens cycles. According to the present embodiment, one cycle of etching and film deposition is repeated 50 times, i.e., 50 cycles of etching and film deposition are carried out. The number of cycles of etching and film deposition is not limited to any particular number, but is established depending on the processed depth of grooves to be defined in the device wafer W.

In the etching step, according to the etching conditions, the reaction gas supply source 42 depicted in FIG. 7 supplies an etching gas of $SF_6$ from the ejection ports 352 under a process pressure of 25 Pa for 5 seconds, and high-frequency electric power of 2500 W is applied to the upper electrode unit 35, plasmatizing the etching gas. High-frequency electric power of 150 W is applied to the lower electrode unit 34, drawing excited ions into the substrate of the device wafer W. Areas of the device wafer W that correspond to the projected dicing lines S are thus etched at a high rate. Since the devices D are covered with the protective films 2b as masks, any damage to the devices D is minimized.

Figure 8:
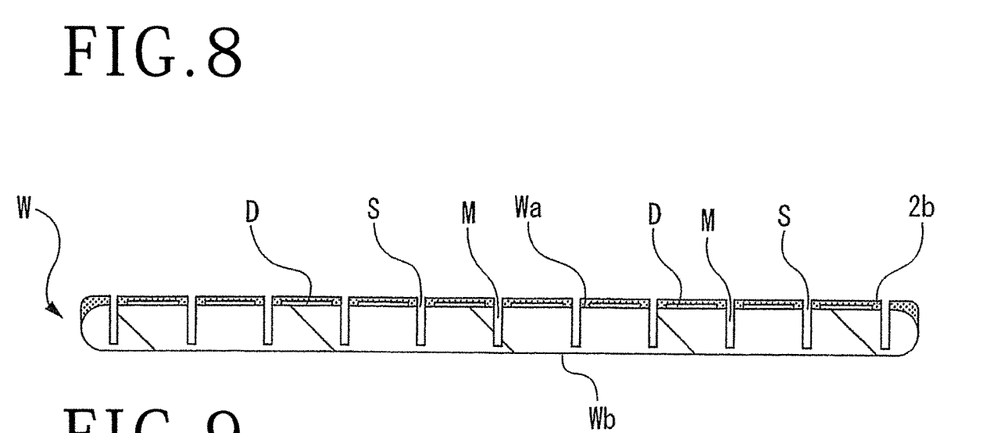
FIG. 8 is a cross-sectional view illustrating an etching step.

Then, according to the conditions for film deposition instead of the etching conditions, the reaction gas supply source 43 supplies a deposition gas of $C_4F_8$ from the ejection ports 352 toward the exposed projected dicing lines S under a process pressure of 25 Pa for 3 seconds, and high-frequency electric power of 2500 W is applied to the upper electrode unit 35, plasmatizing the etching gas. High-frequency electric power of 50 W is applied to the lower electrode unit 34, drawing excited ions into the substrate of the device wafer W. A fluorocarbon (CxFy) film as a protective film is thus deposited on the inner side surfaces of the grooves that have been exposed by the etching process. In this manner, etching and film deposition (for side wall protection) are alternately repeated to perform anisotropic dry etching on the device wafer W along the projected dicing lines S, thereby forming etched grooves M to a predetermined processed depth in the device wafer W as depicted in FIG. 8. During the etching step, the inside of the processing space 30a depicted in FIG. 7 is kept under a predetermined pressure, and the gas discharger 33 discharges the used gas from the discharge port 304.

According to the present embodiment, the predetermined processed depth of the etched grooves M in the device wafer W is set to such a depth that the device wafer W is not fully severed between the face side and the reverse side thereof.

When the reverse side Wb of the device wafer W with the etched grooves M formed therein is subsequently ground by grinding stones or the like, the device wafer W is divided or separated into individual chips carrying the respective devices D thereon. Alternatively, the device wafer W may be divided into individual chips by being fully severed between the face side and the reverse side thereof in the etching step. In such an alternative case, since the device wafer W is divided into individual chips in the etching step, the total number of processing steps is reduced. After the etching step is finished, cleaning water may be supplied to the face side Wa of the device wafer W to remove the protective films 2b with ease.

Figure 9:
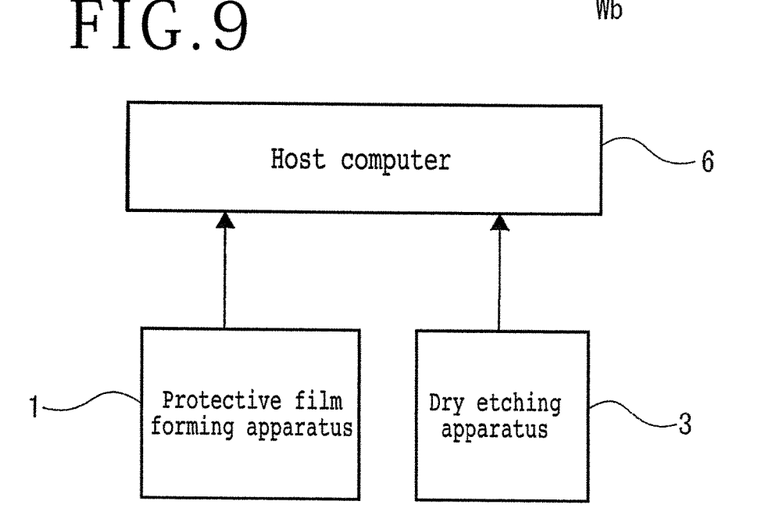
FIG. 9 is a block diagram of a configuration in which the protective film forming apparatus and the dry etching apparatus are connected to a host computer.

As depicted in FIG. 9, the protective film forming apparatus 1 and the dry etching apparatus 3 are connected to a host computer 6 as a terminal apparatus through respective communication links. Specifically, the control means 20 of the protective film forming apparatus 1 is connected to the host computer 6, and the control means 45 of the dry etching apparatus 3 is connected to the host computer 6. The host computer 6 processes and manages data for the protective film forming apparatus 1 and the dry etching apparatus 3. The host computer 6 includes, for example, a CPU for processing data according to control programs, a read only memory (ROM) for storing the control programs, etc., and a random access memory (RAM) for storing processed results and other items of information. The processing conditions set in the control means 20 of the protective film forming apparatus 1 and the control means 45 of the dry etching apparatus 3, the information on the device wafer W, and the time at which the water-soluble protective film agent 2 is applied that is stored in the control means 20 in the applying time recording step are also stored in the RAM of the host computer 6.

(Warning Issuing Step)

A warning is issued if the introduction of the device wafer W into the dry etching apparatus 3 is not confirmed in the introduction confirming step after elapse of a predetermined time from the time recorded in the applying time recording step. The predetermined time from the time recorded in the applying time recording step refers to a time zone in which at least the protective films 2b can be removed by cleaning from the face side Wa of the device wafer W without deterioration. For example, if the device wafer W is not introduced into the dry etching apparatus 3 even after 24 hours have elapsed from the applying time recorded in the RAM of the host computer 6, then a predetermined warning is issued. The warning issuing step is carried out before the etching step is carried out after the protective film forming step has been carried out.

A warning may be issued from an administrator's terminal, not depicted, connected to the host computer 6 to the administrator, or from the protective film forming apparatus 1 or the dry etching apparatus 3 to the administrator. A warning may be displayed on a display screen of the protective film forming apparatus 1, the dry etching apparatus 3, or an administrator's terminal, or may be produced as a sound from a speaker, or may be given as turning-on of an indicator lamp. A device wafer W to which a warning is addressed is reprocessed by removing the protective films 2b from the face side Wa of the device wafer W and forming a protective film again thereon prior to the etching step.

(First Example of Calculating Step)

The host computer 6 calculates the number of device wafers on which to perform the protective film forming step, based on the operation state of the dry etching apparatus 3. The operation state of the dry etching apparatus 3 refers to a state of the dry etching apparatus 3 in which it has actually performed a dry etching process and obtained processed results. Specifically, the operation state of the dry etching apparatus 3 means an actual processing time that is consumed when the dry etching apparatus 3 has dry-etched a single device wafer W under the conditions (etching conditions and film deposition conditions) input to the control means 45. If the processing time consumed by the dry etching apparatus 3 is longer than the processing time consumed by the protective film forming apparatus 1, then the host computer 6 calculates the appropriate number of device wafers W on which the protective film forming apparatus 1 is to perform the protective film forming step, and then controls the protective film forming apparatus 1 to perform the protective film forming step. In this manner, the dwelling time until the device wafer W on which the protective films 2b have been formed in the protective film forming step is introduced into the dry etching apparatus 3 can be shortened. As a consequence, the device wafer W can efficiently be divided into individual chips without deterioration of the protective films 2b.

(Second Example of Calculating Step)

The host computer 6 may calculate the number of device wafers on which to perform the protective film forming step, based on the information input to the protective film forming apparatus 1 and the dry etching apparatus 3. Usually, the protective film forming apparatus 1 and the dry etching apparatus 3 can be supplied with device wafers W, using a cassette that houses a plurality of device wafers W horizontally therein. In other words, respective cassettes, each housing a plurality of device wafers W, are supplied to the protective film forming apparatus 1 and the dry etching apparatus 3. The host computer 6 calculates a time required to process a device wafer W in the protective film forming apparatus 1 and the dry etching apparatus 3 each, based on the information of the device wafers W such as the number, type, size, individual identification codes ID, etc. of the device wafers W housed in the cassettes, and the processing conditions input to the protective film forming apparatus 1 and the dry etching apparatus 3.

Then, the host computer 6 calculates processing timings and the appropriate number of device wafers W on which to perform the protective film forming step, in order to minimize the dwelling time after protective films 2b have been formed on the face side Wa of a device wafer W until the dry etching process. The host computer 6 then controls the protective film forming apparatus 1 to perform the protective film forming step based on the calculated data. Inasmuch as the protective film forming step is carried out after the appropriate number of device wafers W on which to perform the protective film forming step and the processing timings have been calculated, the device wafer W can efficiently be divided into individual chips without deterioration of the protective films 2b, as is the case with the first example of calculating step.

The method of processing a device wafer according to the present invention includes the protective film forming step for forming the protective films 2b that protect the devices D by applying the water-soluble protective film agent 2 to the face side Wa of the device wafer W, while exposing the projected dicing lines S, with the protective film forming apparatus 1, and the etching step for dry-etching the device wafer W through the protective films 2b with the dry etching apparatus 3. The protective films 2b can easily be removed from the face side Wa of the device wafer W simply by supplying cleaning water thereto. Therefore, various pieces of equipment such as a resist film forming apparatus, an ashing apparatus, etc. are not required, resulting in a reduction in the cost, and the device wafer W can efficiently be divided into individual chips.

Upon elapse of a predetermined time after the protective films 2b have been formed by applying the water-soluble protective film agent 2 to the device wafer W, the protective films 2b tend to deteriorate in the dry etching process, and the protective films 2b may not be removed by cleaning water supplied after the device wafer W has been divided into individual chips. The protective films 2b may not be removed prior to the dry etching process. According to the present invention, the time when the water-soluble protective film agent 2 is applied to the device wafer W is recorded in the applying time recording step, and the warning issuing step for issuing a warning is carried out if the introduction of the device wafer W into the dry etching apparatus 3 is not confirmed in the introduction confirming step after elapse of a predetermined time from the time recorded in the applying time recording step, before the etching step is carried out after the protective films 2b have been formed by applying the water-soluble protective film agent 2 to the device wafer W. Consequently, it is possible to give a warning while the protective films 2b can be removed from the device wafer W, and the protective films 2b may be removed and new protective films 2b may be formed again on the face side Wa of the device wafer W. Therefore, it is unlikely to cause damage to the device wafer W in its entirety.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a device wafer having a plurality of devices disposed in respective areas demarcated on a face side thereof by a plurality of projected dicing lines, comprising the steps of:
    applying, with a protective film forming apparatus, a water-soluble protective film agent to the face side of the device wafer to form a protective film thereon for protecting the devices;
    applying a laser beam over the projected dicing lines to remove the protective film over the projected dicing lines;
    thereafter, dry-etching the device wafer through the protective film with a dry etching apparatus;
    recording a time when the water-soluble protective film agent is applied to the device wafer;
    confirming that the device wafer with the protective film formed thereon has been introduced into the dry etching apparatus; and
    issuing a warning if the introduction of the device wafer into the dry etching apparatus is not confirmed upon elapse of a predetermined time from the recorded time.

2. The method according to claim 1, wherein the protective film forming apparatus and the dry etching apparatus are connected to a terminal apparatus through respective communication links, the method further comprising the step of:
    calculating, with the terminal apparatus, the number of device wafers on which the protective films are to be formed based on a processing time for the dry etching apparatus to dry-etch a single device wafer relative to a processing time for the protective film forming apparatus to apply a protective film on a single device wafer.

3. The method according to claim 1, wherein the protective film forming apparatus and the dry etching apparatus are connected to a terminal apparatus through respective communication links and configured to receive a cassette housing a plurality of device wafers, the method further comprising the step of:

calculating, with the terminal apparatus, the number of device wafers on which the protective films are to be formed based on at least one of a number, a type and a size of the plurality of device wafers in the cassette input in the protective film forming apparatus and the dry etching apparatus.

4. The method according to claim 1, wherein the predetermined time from the recorded time refers to a time zone in which the protective film is first formed on the device wafer to when the protective film is removed from the device wafer, by cleaning, after the dry-etching step.

* * * * *